US009312209B2

(12) United States Patent
Shibata et al.

(10) Patent No.: US 9,312,209 B2
(45) Date of Patent: *Apr. 12, 2016

(54) SEMICONDUCTOR DEVICE

(71) Applicant: PS4 LUXCO S.A.R.L., Luxembourg (LU)

(72) Inventors: Kayoko Shibata, Tokyo (JP); Hitoshi Miwa, Kokubunji (JP); Yoshihiko Inoue, Kokubunji (JP)

(73) Assignee: PS4 LUXCO S.A.R.L., Luxembourg (LU)

( * ) Notice: Subject to any disclaimer, the term of this patent is extended or adjusted under 35 U.S.C. 154(b) by 0 days.

This patent is subject to a terminal disclaimer.

(21) Appl. No.: 14/634,510

(22) Filed: Feb. 27, 2015

(65) Prior Publication Data

US 2015/0179549 A1 Jun. 25, 2015

Related U.S. Application Data

(63) Continuation of application No. 14/325,436, filed on Jul. 8, 2014, now Pat. No. 9,032,350, which is a continuation of application No. 13/872,553, filed on Apr. 29, 2013, now Pat. No. 8,839,161, which is a continuation of application No. 12/923,800, filed on Oct. 7, 2010, now Pat. No. 8,584,061.

(30) Foreign Application Priority Data

Oct. 9, 2009 (JP) ................................ 2009-235488

(51) Int. Cl.
*G06F 9/455* (2006.01)
*G06F 17/50* (2006.01)
*H01L 23/48* (2006.01)
*G11C 5/06* (2006.01)
*G11C 29/02* (2006.01)
*G11C 29/12* (2006.01)
*H01L 25/065* (2006.01)
*H01L 27/108* (2006.01)
*H01L 23/538* (2006.01)
*H01L 27/105* (2006.01)
*H01L 21/66* (2006.01)

(52) U.S. Cl.
CPC .............. *H01L 23/481* (2013.01); *G11C 5/063* (2013.01); *G11C 29/025* (2013.01); *G11C 29/12* (2013.01); *G11C 29/1201* (2013.01); *H01L 23/5384* (2013.01); *H01L 25/0657* (2013.01); *H01L 27/1052* (2013.01); *H01L 27/10897* (2013.01); *H01L 22/22* (2013.01); *H01L 2224/16145* (2013.01); *H01L 2225/06513* (2013.01); *H01L 2225/06517* (2013.01); *H01L 2225/06541* (2013.01); *H01L 2225/06596* (2013.01); *H01L 2924/01019* (2013.01); *H01L 2924/01037* (2013.01); *H01L 2924/01055* (2013.01)

(58) Field of Classification Search
USPC .................................. 716/101, 102, 119, 126
See application file for complete search history.

(56) References Cited

U.S. PATENT DOCUMENTS

2005/0127755 A1* 6/2005 Aichriedler et al. ......... 307/10.1
2008/0256497 A1* 10/2008 Wohl et al. ...................... 716/3
2010/0060310 A1* 3/2010 Laisne et al. .................. 326/10

*Primary Examiner* — Brian Ngo
(74) *Attorney, Agent, or Firm* — Kunzler Law Group

(57) ABSTRACT

A method for bypassing a defective through silicon via x in a group of n adjacent through silicon vias, includes receiving a plurality of relief signals to identify the defective through silicon via x, activating x−1 switch circuits to connect x−1 data circuits to through silicon vias 1 to x−1 in the group of n adjacent through silicon vias, activating n−x switch circuits to connect n−x data circuits to through silicon vias x+1 to n in the group of n adjacent through silicon vias, and activating a switch circuit to connect a data circuit to an auxiliary through silicon via which is adjacent through silicon via n in the group of n adjacent through silicon vias.

13 Claims, 10 Drawing Sheets

SEMICONDUCTOR DEVICE

RELATED APPLICATIONS

The present application is a Continuation application of U.S. patent application Ser. No. 14/325,436, which was filed on Jul. 8, 2014, which is a Continuation application of U.S. patent application Ser. No. 13/872,553 (Now U.S. Pat. No. 8,839,161) which is a Continuation application of U.S. patent application Ser. No. 12/923,800 (Now U.S. Pat. No. 8,584,061), which claims priority from Japanese Patent Application No. 2009-235488, filed on Oct. 9, 2009, which are incorporated herein by reference.

BACKGROUND OF THE INVENTION

1. Field of the Invention

The present invention relates to a semiconductor device, and more particularly relates to a semiconductor device including a plurality of semiconductor chips electrically connected by through silicon vias.

2. Description of Related Art

A memory capacity required in semiconductor memory devices such as DRAM (Dynamic Random Access Memory) is increasing every year. In recent years, there has been proposed a method to meet this requirement. In this method, a plurality of memory chips are stacked and electrically connected via through silicon vias arranged on a silicon substrate (see Japanese Patent Application Laid-open No. 2007-158237).

Specifically, in a semiconductor memory device in which an interface chip having front end units such as interface circuits incorporated thereon and a core chip having back end units such as memory cores incorporated thereon are stacked, because read data that is read in parallel from the memory cores is supplied as it is to the interface chip without performing serial conversion, a large number of through silicon vias (approximately 4000 units in some cases) are required. However, the entire chip becomes defective when even one of the through silicon vias becomes defective, and if a plurality of the chips are stacked, all the chips become defective. Thus, to prevent the entire chip from becoming defective due to a defective through silicon via, auxiliary through silicon vias are sometimes provided in such semiconductor memory devices.

In the semiconductor device disclosed in Japanese Patent Application Laid-open No. 2007-158237, one auxiliary through silicon via is allocated to a group of through silicon vias constituted by a plurality of through silicon vias (for example, eight through silicon vias).

However, when a defective through silicon via is simply replaced with an auxiliary through silicon via, an unignorable difference in wiring lengths can occur between signal paths before and after replacement of the through silicon vias depending on a location of the defective through silicon via. That is, for example, when a defect occurs to a through silicon via that is located near the auxiliary through silicon via, a difference in wiring lengths between signal paths before and after replacement of the through silicon vias is very small. However, when a defect occurs to a through silicon via that is located away from the auxiliary through silicon via, a signal path after replacement of the through silicon vias is longer by an amount equivalent to detouring of a signal path up to the auxiliary through silicon via. Such a difference in the wiring lengths can generate skew in a signal input into and/or output from the through silicon via. The skew can degrade the signal quality.

This problem is not limited to semiconductor memory devices such as DRAMs, but can occur to all semiconductor devices that include a plurality of semiconductor chips that are electrically connected to each other via through silicon vias.

SUMMARY

In one embodiment, there is provided a semiconductor device comprising: a first semiconductor chip that includes $1^{st}$ to $n^{th}$ driver circuits and an output switching circuit; a second semiconductor chip that includes $1^{st}$ to $n^{th}$ receiver circuits and an input switching circuit; and $1^{st}$ to $n+m^{th}$ through silicon vias provided on at least one of the first and second semiconductor chips, wherein the output switching circuit selectively connects each of the $1^{st}$ to $n^{th}$ driver circuits to different ones of the $1^{st}$ to $n+m^{th}$ through silicon vias by connecting an $i^{th}$ driver circuit to one of $i^{th}$ to $i+m^{th}$ through silicon vias, where i is an integer among 1 to n, and the input switching circuit selectively connects each of the $1^{st}$ to $n^{th}$ receiver circuits to different ones of the $1^{st}$ to $n+m^{th}$ through silicon vias by connecting an $i^{th}$ receiver circuit to one of $i^{th}$ to $i+m^{th}$ through silicon vias.

According to the present invention, a defective through silicon via is not simply replaced by an auxiliary through silicon via, but the defective through silicon via is bypassed by shifting a connection relation between driver circuits and the through silicon vias and a connection relation between receiver circuits and the through silicon vias can be flexibly switched. Therefore, almost no difference in wiring lengths occurs between signal paths before and after replacement of the through silicon vias. Thus, because almost no skew is generated, the signal quality can be enhanced.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
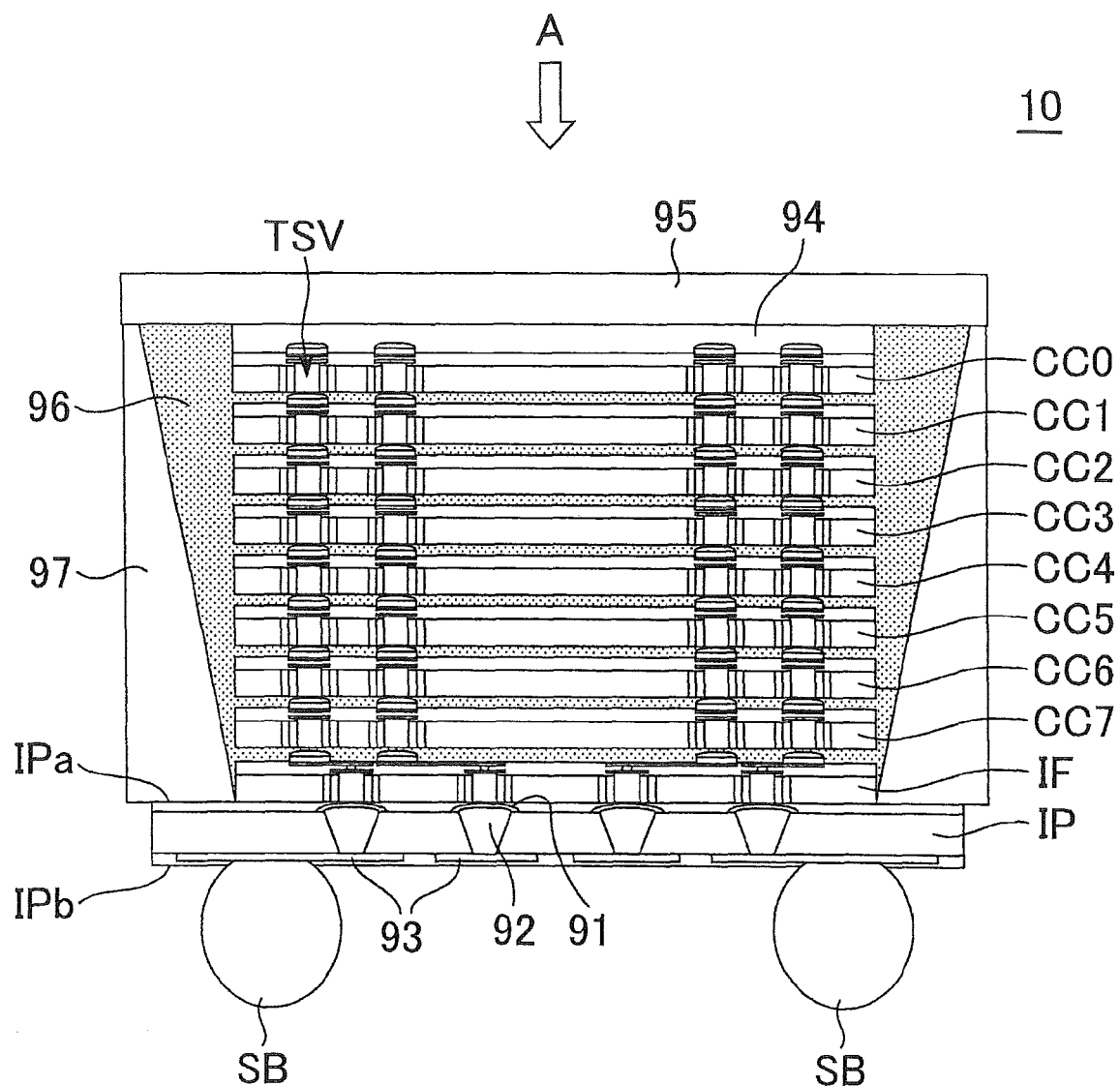
FIG. 1 is a schematic cross-sectional view for explaining the structure of a semiconductor memory device 10 according to the preferred embodiment of the present invention.

FIG. 1 is a schematic cross-sectional view provided to explain the structure of a semiconductor memory device 10 according to the preferred embodiment of the present invention.

As shown in FIG. 1, the semiconductor memory device 10 according to this embodiment has the structure where 8 core chips CC0 to CC7 that have the same function and structure and are manufactured using the same manufacture mask, an interface chip IF that is manufactured using a manufacture mask different from that of the core chips and an interposer IP are laminated. The core chips CC0 to CC7 and the interface chip IF are semiconductor chips using a silicon substrate and are electrically connected to adjacent chips in a vertical direction through plural through silicon vias TSV penetrating the silicon substrate. Meanwhile, the interposer IP is a circuit board that is made of a resin, and plural external terminals (solder balls) SB are formed in a back surface IPb of the interposer IP.

Each of the core chips CC0 to CC7 is a semiconductor chip which consists of circuit blocks other than a so-called front end unit (front end function) performing a function of an interface with an external device through an external terminal among circuit blocks included in a 1 Gb DDR3 (Double Data Rate 3)-type SDRAM (Synchronous Dynamic Random Access Memory). The SDRAM is a well-known and common memory chip that includes the front end unit and a so-called back end unit having a plural memory cells and accessing to the memory cells. The SDRAM operates even as a single chip and is capable to communicate directly with a memory controller. That is, each of the core chips CC0 to CC7 is a semiconductor chip where only the circuit blocks belonging to the back end unit are integrated in principle. As the circuit blocks that are included in the front end unit, a parallel-serial converting circuit (data latch circuit) that performs parallel/serial conversion on input/output data between a memory cell array and a data input/output terminal and a DLL (Delay Locked Loop) circuit that controls input/output timing of data are exemplified, which will be described in detail below. The interface chip IF is a semiconductor chip in which only the front end unit is integrated. Accordingly, an operation frequency of the interface chip is higher than an operation frequency of the core chip. Since the circuits that belong to the front end unit are not included in the core chips CC0 to CC7, the core chips CC0 to CC7 cannot be operated as the single chips, except for when the core chips are operated in a wafer state for a test operation in the course of manufacturing the core chips. The interface chip IF is needed to operate the core chips CC0 to CC7. Accordingly, the memory integration of the core chips is denser than the memory integration of a general single chip. In the semiconductor memory device 10 according to this embodiment, the interface chip has a front end function for communicating with the external device at a first operation frequency, and the plural core chips have a back end function for communicating with only the interface chip at a second operation frequency lower than the first operation frequency. Accordingly, each of the plural core chips includes a memory cell array that stores plural information, and a bit number of plural read data for each I/O (DQ) that are supplied from the plural core chips to the interface chip in parallel is plural and associated with a one-time read command provided from the interface chip to the core chips. In this case, the plural bit number corresponds to a prefetch data number to be well-known.

The interface chip IF functions as a common front end unit for the eight core chips CC0 to CC7. Accordingly, all external accesses are performed through the interface chip IF and inputs/outputs of data are also performed through the interface chip IF. In this embodiment, the interface chip IF is disposed between the interposer IP and the core chips CC0 to CC7. However, the position of the interface chip IF is not restricted in particular, and the interface chip IF may be disposed on the core chips CC0 to CC7 and may be disposed on the back surface IPb of the interposer IP. When the interface chip IF is disposed on the core chips CC0 to CC7 in a face-down manner or is disposed on the back surface IPb of the interposer IP in a face-up manner, the through silicon via TSV does not need to be provided in the interface chip IF. The interface chip IF may be disposed to be interposed between the two interposers IP.

The interposer IP functions as a rewiring substrate to increase an electrode pitch and secures mechanical strength of the semiconductor memory device 10. That is, an electrode 91 that is formed on a top surface IPa of the interposer IP is drawn to the back surface IPb via a through-hole electrode 92 and the pitch of the external terminals SB is enlarged by the rewiring layer 93 provided on the back surface IPb. In FIG. 1, only the two external terminals SB are shown. In actuality, however, three or more external terminals are provided. The layout of the external terminals SB is the same as that of the DDR3-type SDRAM that is determined by the regulation. Accordingly, the semiconductor memory device can be treated as one DDR3-type SDRAM from the external controller.

As shown in FIG. 1, a top surface of the uppermost core chip CC0 is covered by an NCF (Non-Conductive Film) 94 and a lead frame 95. Gaps between the core chips CC0 to CC7 and the interface chip IF are filled with an underfill 96 and surrounding portions of the gaps are covered by a sealing resin 97. Thereby, the individual chips are physically protected.

Figures 2A, 2B, 2C:
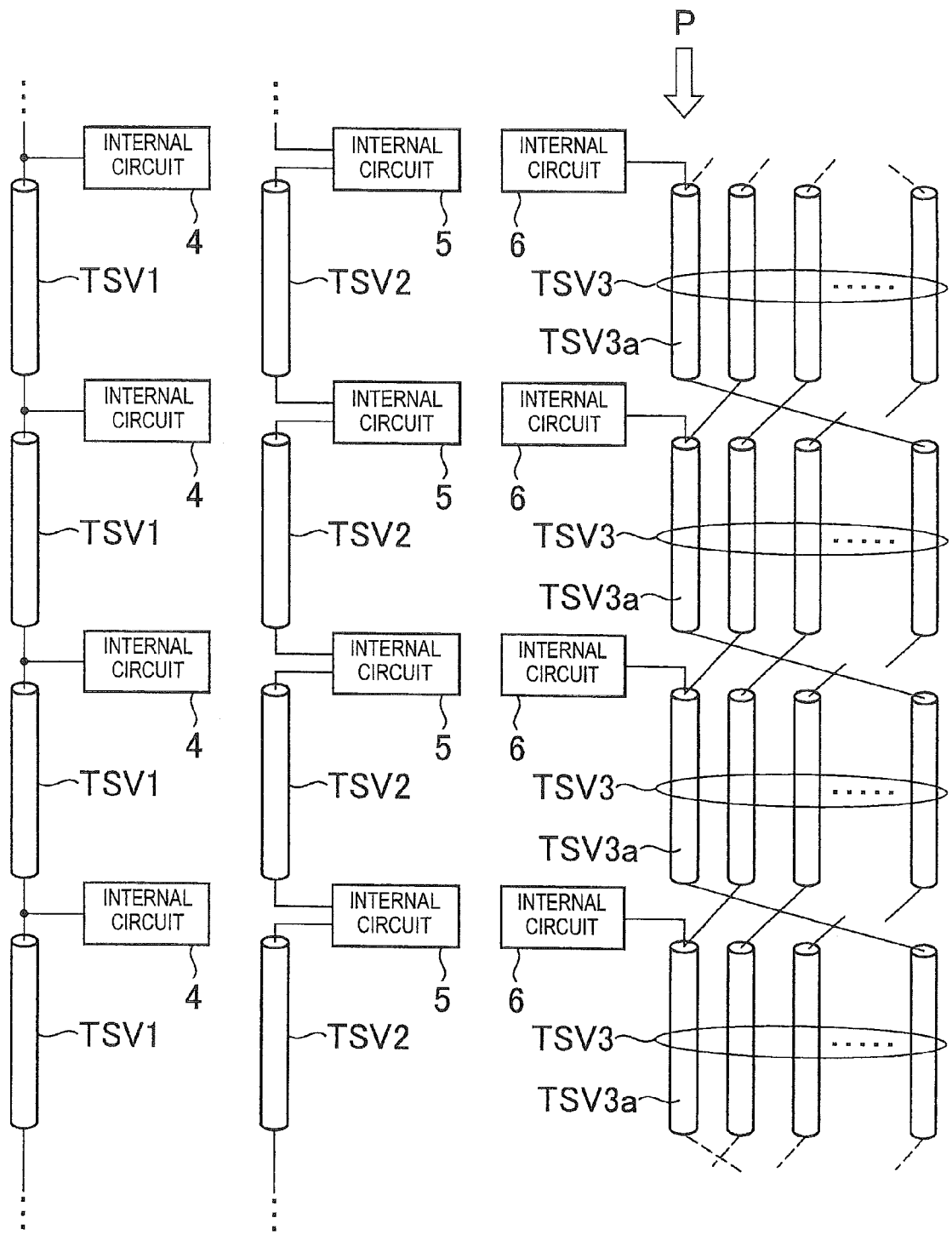
FIGS. 2A to 2C are diagram showing the various types of through silicon via TSV provided in a core chip.

When most of the through silicon vias TSV provided in the core chips CC0 to CC7 are two-dimensionally viewed from a lamination direction, that is, viewed from an arrow A shown in FIG. 1, the through silicon vias TSV are short-circuited from the through silicon vias TSV of other layers provided at the same position. That is, as shown in FIG. 2A, the vertically disposed through silicon vias TSV1 that are provided at the same position in plain view are short-circuited, and one wiring line is configured by the through silicon via TSV1. The through silicon via TSV1 that are provided in the core chips CC0 to CC7 are connected to internal circuits 4 in the core chips, respectively. Accordingly, input signals (command signal, address signal, etc.) that are supplied from the interface chip IF to the through silicon vias TSV1 shown in FIG. 2A are commonly input to the internal circuits 4 of the core chips CC0 to CC7. Output signals (data etc.) that are supplied from the core chips CC0 to CC7 to the through silicon via TSV1 are wired-ORed and input to the interface chip IF.

Meanwhile, as shown in FIG. 2B, the a part of through silicon vias TSV are not directly connected to the through silicon via TSV2 of other layers provided at the same position in plain view but are connected to the through silicon via TSV2 of other layers through the internal circuits 5 provided in the core chips CC0 to CC7. That is, the internal circuits 5 that are provided in the core chips CC0 to CC7 are cascade-connected through the through silicon via TSV2. This kind of through silicon via TSV2 is used to sequentially transmit predetermined information to the internal circuits 5 provided in the core chips CC0 to CC7. As this information, layer address information to be described below is exemplified.

Another group of through silicon vias TSV is short-circuited from the TSVs of other layer provided at the different position in plan view, as shown in FIG. 2C. With respect to this kind of group of through silicon via TSV3, internal circuits 6 of the core chips CC0 to CC7 are connected to the through silicon via TSV3a provided at the predetermined position P in plain view. Thereby, information can be selectively input to the internal circuits 6 provided in the core chips. As this information, defective chip information to be described below is exemplified.

As such, as types of the through silicon vias TSV provided in the core chips CC0 to CC7, three types (TSV1 to TSV3) shown in FIGS. 2A to 2C exist. As described above, most of the through silicon vias TSV are of a type shown in FIG. 2A, and an address signal, a command signal, and a clock signal are supplied from the interface chip IF to the core chips CC0 to CC7, through the through silicon via TSV1 of the type shown in FIG. 2A. Read data and write data are input to and output from the interface chip IF through the through silicon via TSV1 of the type shown in FIG. 2A. Meanwhile, the through silicon vias TSV2 and TSV3 of the types shown in FIGS. 2B and 2C are used to provide individual information to the core chips CC0 to CC7 having the same structure.

Figure 3:
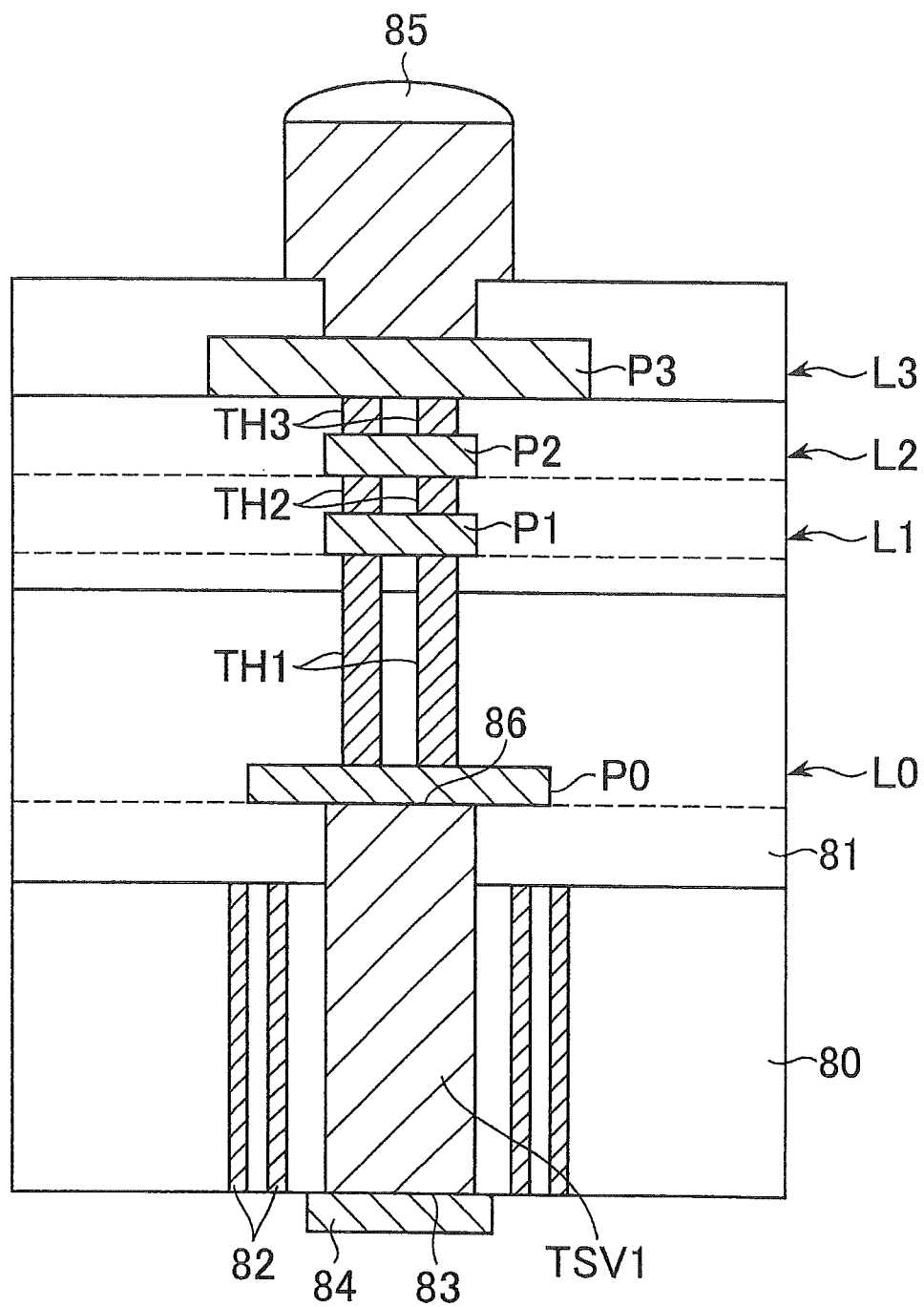
FIG. 3 is a cross-sectional view showing the structure of the through silicon via TSV1 of the type shown in FIG. 2A.

FIG. 3 is a cross-sectional view showing the structure of the through silicon via TSV1 of the type shown in FIG. 2A.

As shown in FIG. 3, the through silicon via TSV1 is provided to penetrate a silicon substrate 80 and an interlayer insulating film 81 provided on a surface of the silicon substrate 80. Around the through silicon via TSV1, an insulating ring 82 is provided. Thereby, the through silicon via TSV1 and a transistor region are insulated from each other. In an example shown in FIG. 3, the insulating ring 82 is provided double. Thereby, capacitance between the through silicon via TSV1 and the silicon substrate 80 is reduced.

An end 83 of the through silicon via TSV1 at the back surface of the silicon substrate 80 is covered by a back surface bump 84. The back surface bump 84 is an electrode that contacts a surface bump 85 provided in a core chip of a lower layer. The surface bump 85 is connected to an end 86 of the through silicon via TSV1, through plural pads P0 to P3 provided in wiring layers L0 to L3 and plural through-hole electrodes TH1 to TH3 connecting the pads to each other. Thereby, the surface bump 85 and the back surface bump 84 that are provided at the same position in plain view are short-circuited. Connection with internal circuits (not shown in the drawings) is performed through internal wiring lines (not shown in the drawings) drawn from the pads PO to P3 provided in the wiring layers L0 to L3.

A relief method that is used when a defect occurs to a through silicon via is explained below. The relief method explained below can be applied to any type of the through silicon vias TSV1 to TSV3 explained above.

Figure 4:
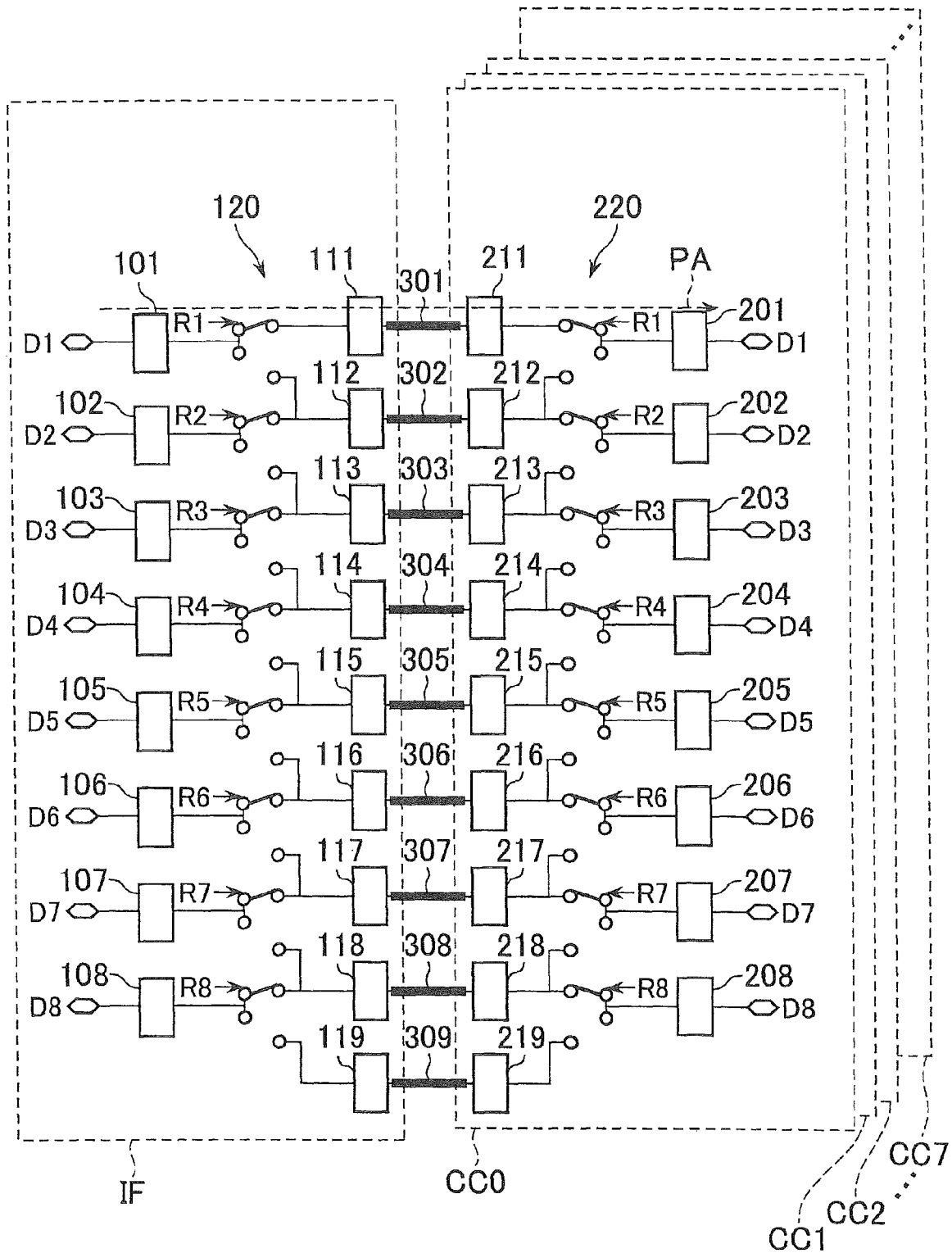
FIG. 4 is a schematic circuit diagram showing a first embodiment of the present invention, and shows a state where none of the through silicon vias is defective.

FIG. 4 is a schematic circuit diagram for explaining a connection relation between the interface chip IF and the core chips CC0 to CC7 according to a first embodiment of the present invention. FIG. 4 shows a state where none of the through silicon vias is defective.

In FIG. 4, as an example, there is shown a portion where 8-bit data D1 to D8 is supplied from the interface chip IF to each of the core chips CC0 to CC7. The data D1 to D8 are signals that need to be simultaneously output from the interface chip IF and simultaneously input into each of the core chips CC0 to CC7. Address signals and write data are examples of such data.

As shown in FIG. 4, the interface chip IF includes eight driver circuits 101 to 108 corresponding to the data D1 to D8, and each of the core chips CC0 to CC7 includes eight receiver circuits 201 to 208 corresponding to the data D1 to D8. Meanwhile, in the first embodiment, nine (8+1) through silicon vias 301 to 309 are prepared to connect the driver circuits 101 to 108 to the receiver circuits 201 to 208. Among the through silicon vias 301 to 309, the through silicon via 309 is an auxiliary through silicon via, and the through silicon via 309 is not used unless any of the other through silicon vias 301 to 308 is defective.

To explain specifically, the interface chip IF includes an output switching circuit 120 that connects an output terminal of each of the driver circuits 101 to 108 to one of the two corresponding through silicon vias via driver circuits 111 to 119. "Two corresponding through silicon vias" means an i-th through silicon via and an (i+1)-th through silicon via when a last digit of a reference number of the driver circuits 101 to 108 is taken as i (i is a value among 1 to 8). For example, a first through silicon via 301 and a second through silicon via 302 correspond to the driver circuit 101, and the through silicon via 302 and a third through silicon via 303 correspond to the driver circuit 102. Thus, some of the through silicon vias, that is, the through silicon vias 302 to 308, correspond to two driver circuits. However, two driver circuits are never connected to the same through silicon via. Thus, a connection to each through silicon via is performed exclusively. Which one of the two corresponding through silicon vias is to be selected is decided by relief signals R1 to R8.

The relief signals R1 to R8 are allocated to the through silicon vias 301 to 308, respectively. One of the relief signals R1 to R8 is activated when a corresponding through silicon via is defective. Assuming that a relief signal Rx is activated, an i-th through silicon via is selected for a driver circuit whose last digit of a reference number is 1 to x−1, and an (i+1)-th through silicon via is selected for a driver circuit whose last digit of a reference number is x to 8. In the example shown in FIG. 4, none of the relief signals R1 to R8 is active, and thus the output switching circuit 120 connects the output terminals of the driver circuits 101 to 108 to the through silicon vias 301 to 308 via the driver circuits 111 to 118, respectively.

The same connection relation holds true on a core chips CC0 to CC7 side. Specifically, each of the core chips CC0 to CC7 includes an input switching circuit 220, and as shown in the example of FIG. 4, when none of the relief signals R1 to R8 is active, the input switching circuit 220 connects input terminals of the receiver circuits 201 to 208 to the through silicon vias 301 to 308 via receiver circuits 211 to 218, respectively.

In this manner, when none of the through silicon vias 301 to 308 is defective, each of the driver circuits is connected to corresponding one of the receiver circuits via a path PA, and the auxiliary through silicon via 309 is not used.

On the other hand, when one of the through silicon vias 301 to 308 becomes defective, the through silicon via 309 is used. The defective through silicon via is not simply replaced by the through silicon via 309; however, a connection relation among the through silicon vias 301 to 308 and the driver circuits 101 to 108 and a connection relation among the through silicon vias 301 to 308 and the receiver circuits 201 to 208 are shifted with the defective through silicon via as a boundary.

Figure 5:
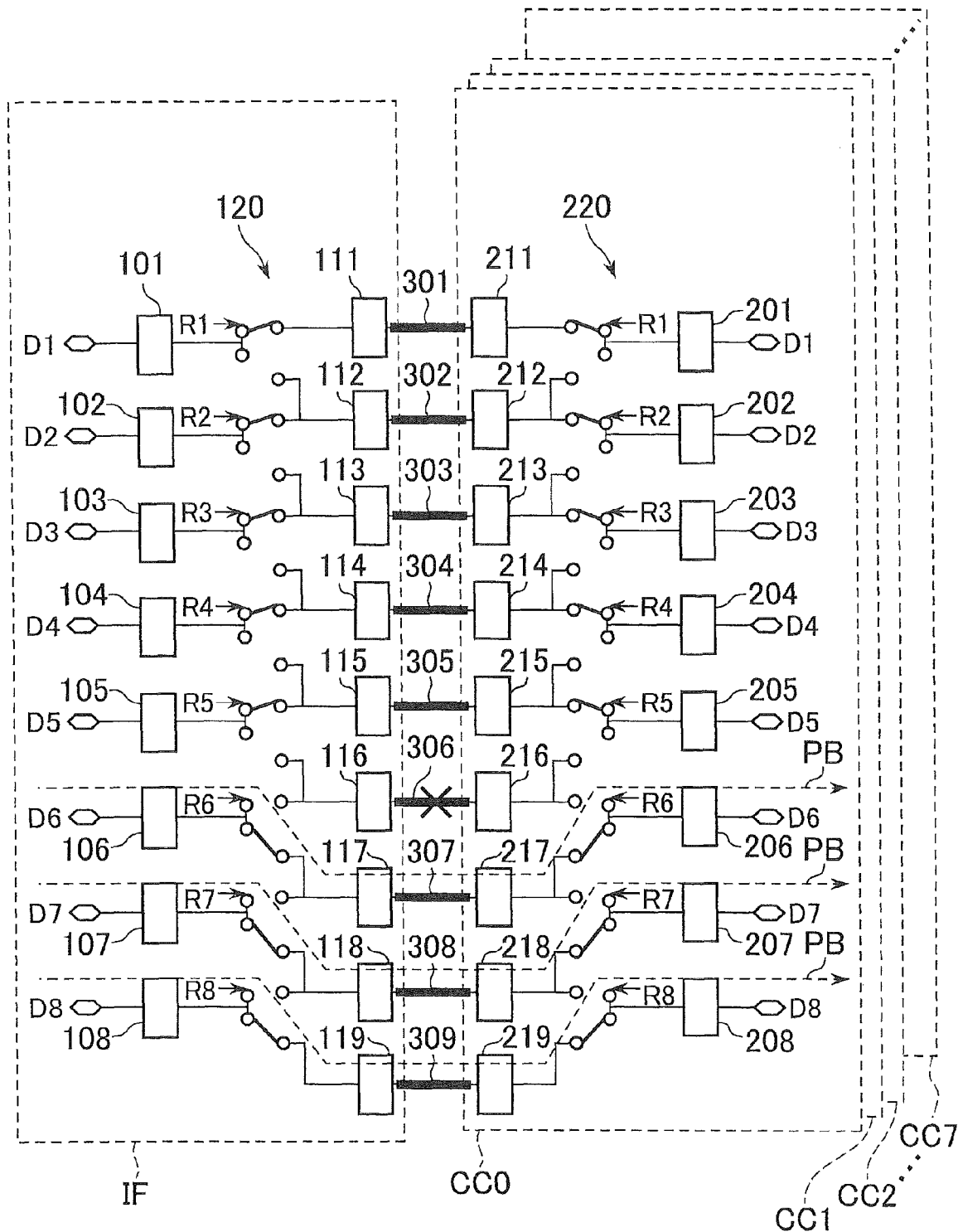
FIG. 5 is showing a first embodiment of the present invention, and shows a state where a defect is generated in the through silicon via 306.

FIG. 5 is a schematic circuit diagram of a state where a defect is generated in the through silicon via 306.

As shown in FIG. 5, the relief signal R6 is activated when a defect is generated in the through silicon via 306. As a result, the output switching circuit 120 connects the output terminals of the driver circuits 101 to 105 to the through silicon vias 301 to 305 via the driver circuits 111 to 115, respectively, and connects the output terminals of the driver circuits 106 to 108 to the through silicon vias 307 to 309 via the driver circuits 117 to 119, respectively. In this manner, a connection relation among the through silicon vias 301 to 309 and the driver circuits 101 to 108 is shifted with the defective through silicon via as a boundary.

The same connection relation holds true even on the core chips CC0 to CC7 side. That is, the input switching circuit 220 connects, in response to activation of the relief signal R6, the input terminals of the receiver circuits 201 to 205 to the through silicon vias 301 to 305 via the receiver circuits 211 to 215, respectively, and connects the input terminals of the receiver circuits 206 to 208 to the through silicon vias 307 to 309 via the receiver circuits 217 to 219, respectively. In this manner, even on the input side, a connection relation among the through silicon vias 301 to 309 and the receiver circuits 201 to 208 is shifted with the defective through silicon via as a boundary.

In this manner, when the through silicon via 306 is defective, the driver circuits 101 to 105 are connected to the receiver circuits 201 to 205, respectively, via the path PA; however, the driver circuits 106 to 108 are connected to the receiver circuits 206 to 208, respectively, via a path PB. That is, when a through silicon via 30x is defective, the driver circuits 101 to 10(x−1) are connected to the receiver circuits 201 to 20(x−1), respectively, via the path PA, and the driver circuits 10x to 108 are connected to the receiver circuits 20x to 208, respectively, via the path PB.

That is, the defective through silicon via (the through silicon via 306 shown in FIG. 5) is not simply replaced by the auxiliary through silicon via (the through silicon via 309 shown in FIG. 5); however, the connection relation among the through silicon vias 301 to 308 and the driver circuits 101 to 108, and the connection relation among the through silicon vias 301 to 308 and the receiver circuits 201 to 208 are shifted with the defective through silicon via as a boundary. In this manner, even after replacement of through silicon vias, an output terminal of a driver circuit having a relatively larger reference number is connected to a through silicon via having a relatively larger reference number, and an input terminal of a receiver circuit having a relatively larger reference number is connected to the through silicon via having the relatively larger reference number. Therefore, when the through silicon vias 301 to 309 are arranged in this order, as far as the i-th through silicon via and the (i+1)-th through silicon via are arranged adjacent to each other, a difference in wiring lengths almost does not occur between signal paths before and after replacement of the through silicon vias. Because almost no skew is generated due to replacement of through silicon vias, the signal quality can be enhanced.

Figure 6:
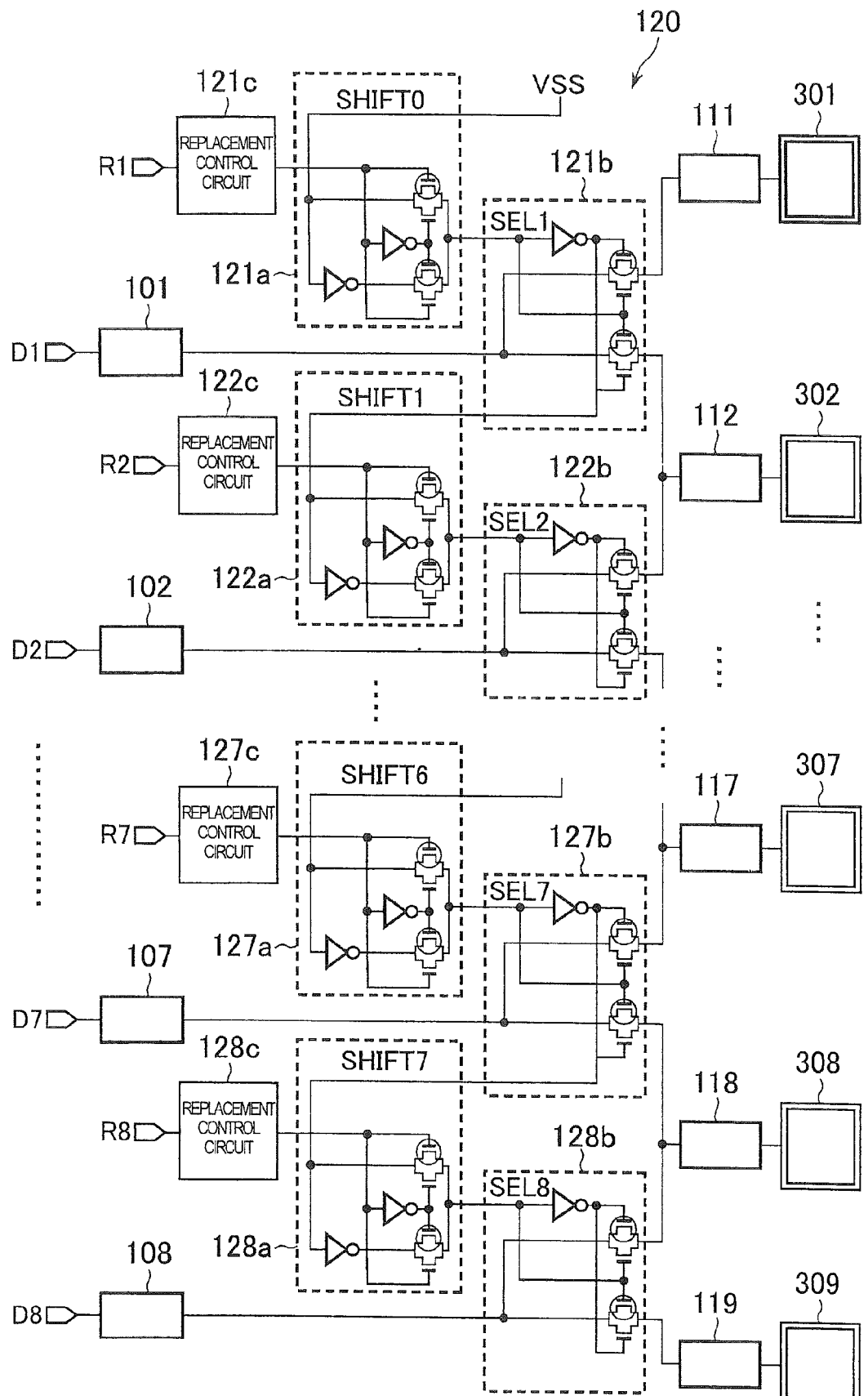
FIG. 6 is a circuit diagram showing in further detail a portion of the output switching circuit 120.

FIG. 6 is a circuit diagram showing in further detail a portion of the output switching circuit 120 shown in FIGS. 4 and 5.

As shown in FIG. 6, the output switching circuit 120 includes control circuit units 121a to 128a and switch circuit units 121b to 128b corresponding to the driver circuits 101 to 108, respectively. The control circuit units 121a to 128a are exclusive OR (EOR) circuits that receive a relief signal Ri and a shift signal SHIFT (i−1). The switch circuit units 121b to 128b are controlled by selection signals SEL1 to SEL8 output from the control circuit units 121a to 128a, respectively.

This is specifically explained below. The control circuit units 121a to 128a output high level selection signals SELi when logical levels of the relief signal Ri and the shift signal SHIFT (i−1) differ, and they output low level selection signals SELi when logical levels of the relief signal Ri and the shift signal SHIFT (i−1) are the same. The relief signals R1 to R8 are activated to the low level when corresponding one of the through silicon vias is defective, and they are activated to the high level when corresponding one of the through silicon vias is normal. The relief signals R1 to R8 are held in replacement control circuits 121c to 128c, respectively. The relief signals R1 to R8 are held until power is turned off. Ingenious attempts need to be made to reduce the number of wirings or the number of through silicon vias through which a relief signal is transmitted. Such attempts include coding the relief signal before transmitting, transmitting the relief signal in a time multiplexing manner. When the relief signal is processed in this manner, the replacement control circuits 121c to 128c have to decode the relief signal. This is why the replacement control circuits 121c to 128c are provided.

Meanwhile, shift signals SHIFT1 to SHIFT7 are inverted signals of the selection signals SEL1 to SEL7, respectively, that are output from a previous stage control circuit unit (that is, a control circuit unit having one reduced reference number) among the control circuit units 121a to 127a. A logical level of a shift signal SHIFT0 that is supplied to the control circuit unit 121a, which is a first stage control circuit unit, is fixed to the low level (VSS).

Each of the switch circuit units 121b to 128b includes two transfer gates that become exclusively conductive. A transfer gate on an i-th through silicon via side is selected when a corresponding selection signal SELi has the high level, and a transfer gate on an (i+1)-th through silicon via side is selected when a corresponding selection signal SELi has the low level.

In this configuration, when all of the relief signals R1 to R8 have the high level, that is, when all the through silicon vias 301 to 308 are normal, all the selection signals SEL1 to SEL8 have the high level, and each of the switch circuit units 121b to 128b selects the i-th through silicon via. Therefore, the output terminals of the driver circuits 101 to 108 are connected to the through silicon vias 301 to 308 via the driver circuits 111 to 118, respectively.

On the other hand, when one of the relief signals R1 to R8 has the low level, that is, when one of the through silicon vias 301 to 308 is defective, a selection signal SELx corresponding to the defective through silicon via has the low level, and corresponding one of the switch circuit unit 12xb selects the (i+1)-th through silicon via. Moreover, when the selection signal SELx has the low level, because a shift signal SHIFTx has the high level, each of the switch circuit units 12 (x+1)b to 128b provided at a next stage selects the (i+1)-th through silicon via. In this manner, a shifting operation is realized with the defective through silicon via as a boundary.

A combination of signals in which the shift signal is high level and the relief signal is low level is not permitted to be input. Such a combination of signals is a pattern that occurs when the number of the defective through silicon vias exceeds the number of the auxiliary through silicon vias. If such a combination of signals occurs, the relief based on the auxiliary through silicon via fails.

While the circuit configuration and operations of the output switching circuit 120 have been explained above, the circuit configuration and operations of the input switching circuit 220 are identical to those, and thus explanations thereof will be omitted.

Figure 7:
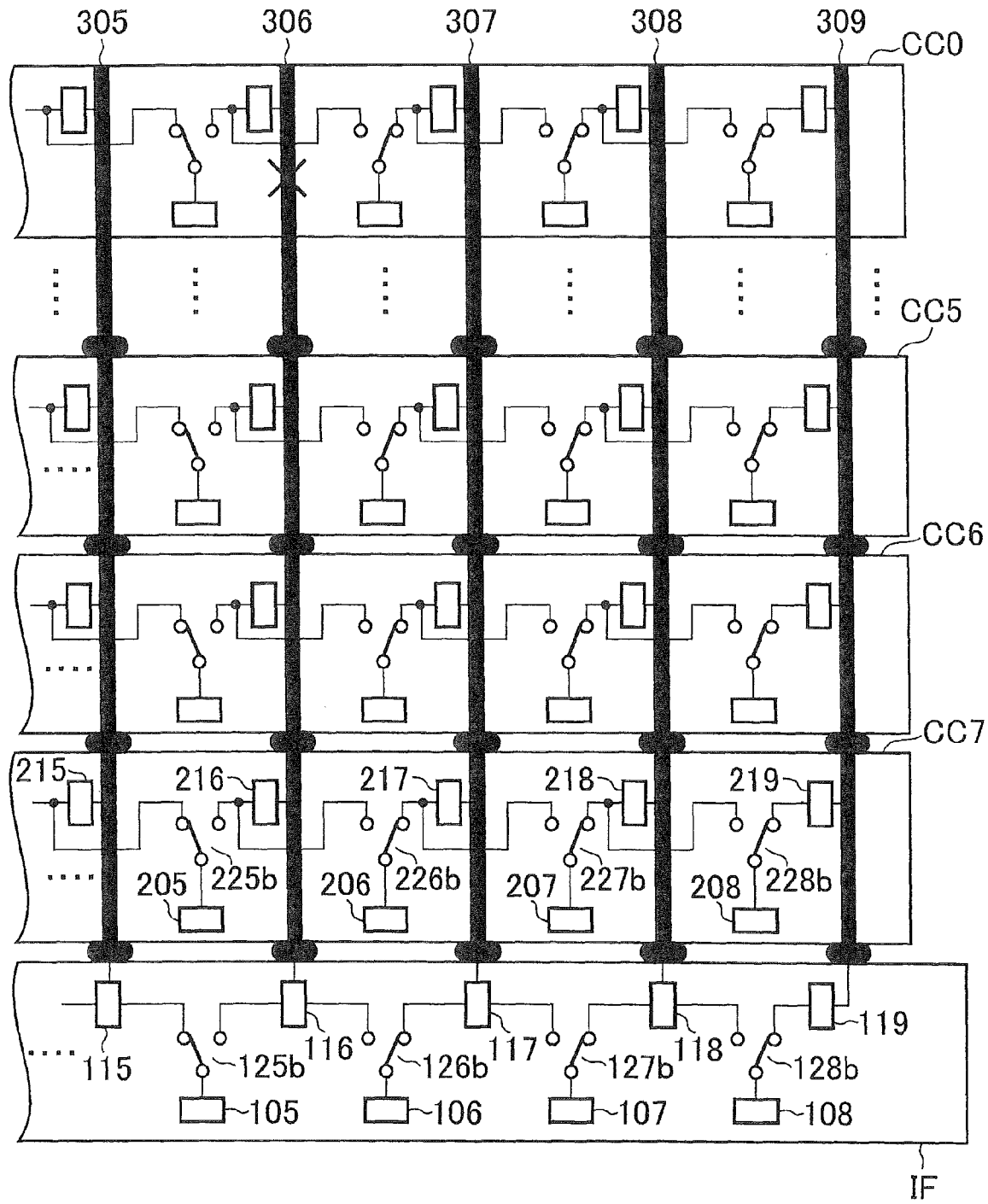
FIG. 7 is a schematic diagram showing a connection relation between the interface chip IF and the core chips CC0 to CC7.

FIG. 7 is a schematic diagram showing a connection relation between the interface chip IF and the core chips CC0 to CC7.

FIG. 7 shows a case where the through silicon via 306 in the core chip CC0 among the core chips CC0 to CC7 is defective. As shown in FIG. 7, among the through silicon vias in the core chips CC0 to CC7, the corresponding through silicon vias, that is, the through silicon vias that have been allocated with the same reference number, are all short-circuited. That is, when a through silicon via in one of the core chips CC0 to CC7 is defective, the corresponding through silicon vias in the other core chips are all invalidated. In the example shown in FIG. 7, because the through silicon via 306 in the core chip CC0 is defective, the through silicon vias 306 in the other core chips CC1 to CC7 are invalidated irrespective of whether they are defective. That is, the connection relation between the through silicon vias and the driver circuits, and the connection relation between the through silicon vias and the receiver circuits are the same in the interface chip IF and the core chips CC0 to CC7.

Figure 8:
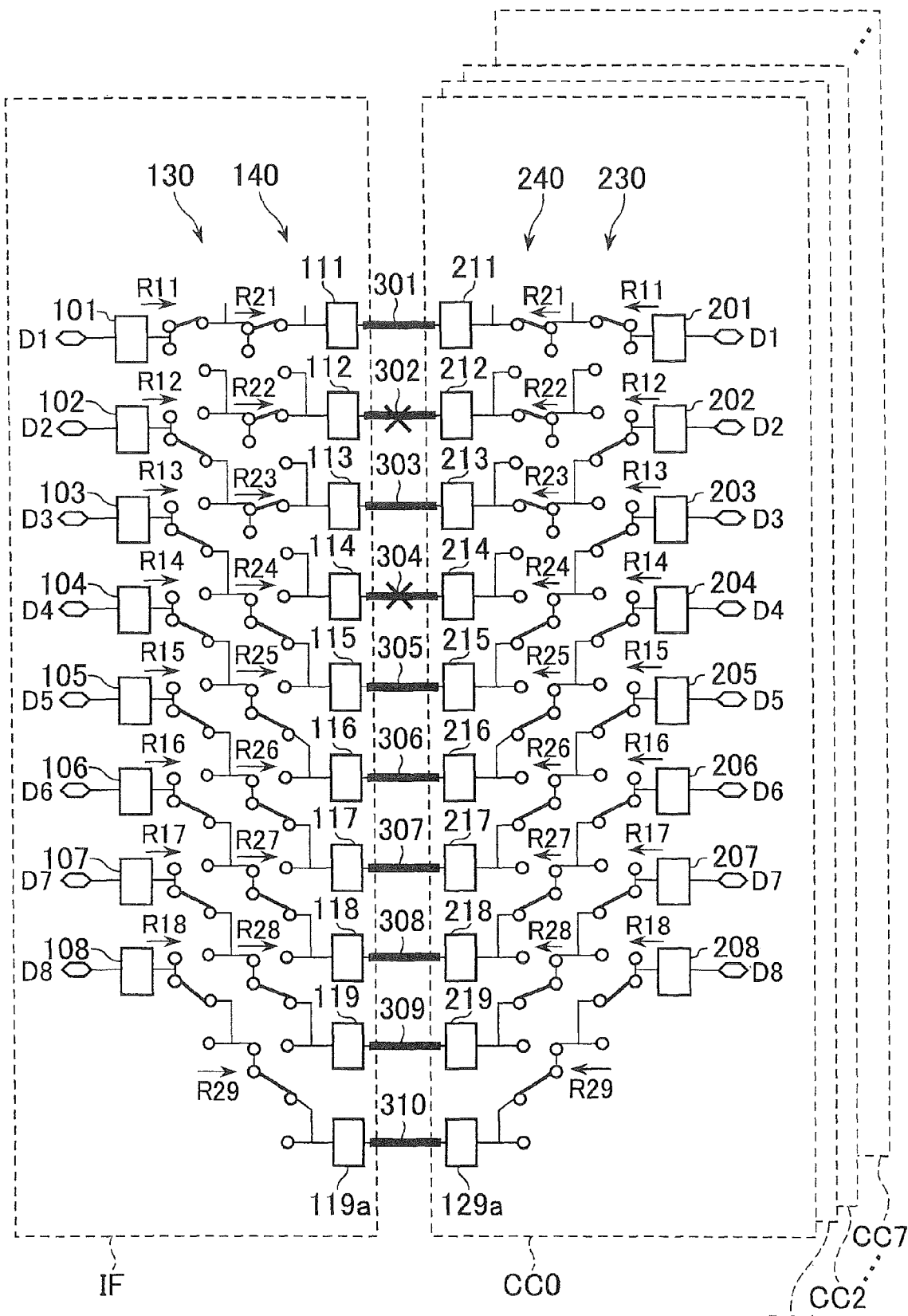
FIG. 8 is a schematic circuit diagram showing a second embodiment of the present invention, and shows a case where the through silicon vias 302 and 304 are defective.

FIG. 8 is a schematic circuit diagram for explaining a connection relation between the interface chip IF and the core chips CC0 to CC7 according to a second embodiment of the present invention, and shows a case where the through silicon vias 302 and 304 are defective.

As shown in FIG. 8, in the second embodiment, two auxiliary through silicon vias 309 and 310 are allocated with respect to eight through silicon vias 301 to 308. That is, the total number of the through silicon vias is ten.

In the second embodiment, two output switching circuits 130 and 140 are arranged on an interface chip IF side, and two input switching circuits 230 and 240 are arranged on the core chips CC0 to CC7 side. Relief signals R11 to R18 are supplied to the output switching circuit 130 and the input switching circuit 230, and switching of output paths and input paths is performed based on these relief signals. Similarly, relief signals R21 to R29 are supplied to the output switching circuit 140 and the input switching circuit 240, and switching of output paths and input paths is performed based on these relief signals. By providing the two output switching circuits 130 and 140 and the two input switching circuits 230 and 240, the connection relation between the through silicon vias 301 to 310 and the driver circuits 101 to 108, and the connection relation between the through silicon vias 301 to 310 and the receiver circuits 201 to 208 can be shifted by maximum two units.

Only one bit of the relief signals R11 to R18 is activated when one or two of the eight through silicon vias 301 to 308 are defective. When one through silicon via 30x is defective, a corresponding relief signal Rx is activated, and when two through silicon vias 30x and 30y (x<y) are defective, a relief signal Rx corresponding to a through silicon via having a relatively smaller reference number is activated. The relief based on the auxiliary through silicon vias according to the present embodiment fails if three or more through silicon vias among the through silicon vias 301 to 308 are defective. Only one bit of the relief signals R21 to R29 is activated when there are two defective through silicon vias among the eight through silicon vias 301 to 309. Specifically, when two through silicon vias 30x and 30y (x<y) are defective, a relief signal Ry corresponding to a through silicon via having a relatively larger reference number is activated. In this condition, the relief signal R21 is never activated. Therefore, a logical level of the relief signal R21 can be fixed to a non-activation logical level. However, because it is desirable that the number of logical steps between each of the driver circuits and each of the through silicon vias are equal to the number of logical steps between each of the through silicon vias and each of the receiver circuits, as shown in FIG. 8, it is preferable not to omit a logical gate using the relief signal R21.

With the above configuration, when one of the eight through silicon vias 301 to 308 is defective, in the same manner as the first embodiment, the problem is solved by shifting the connection relation by one through silicon via with the defective through silicon via as a boundary. Further, when two through silicon vias among nine through silicon vias 301 to 309 are defective, the problem is solved by, between the two defective through silicon vias, first shifting the connection relation by one through silicon via with a defective through silicon via having a relatively smaller reference number as a boundary, and then further shifting the connection relation by one through silicon via with a defective through silicon via having a relatively larger reference number as a boundary.

In the example shown in FIG. 8, two through silicon vias 302 and 304 are defective, and thus relief signals R12 and R24 are activated. In this manner, a shifting operation is performed first by the output switching circuit 130 with the through silicon via 302 as a boundary. Therefore, the output terminal of the driver circuit 102 is connected to the through silicon via 303. Moreover, a shifting operation is performed by the output switching circuit 140 with the through silicon via 304 as a boundary, and therefore the output terminal of the driver circuit 103 is connected to the through silicon via 305. The same holds true on the input side.

Figure 9:
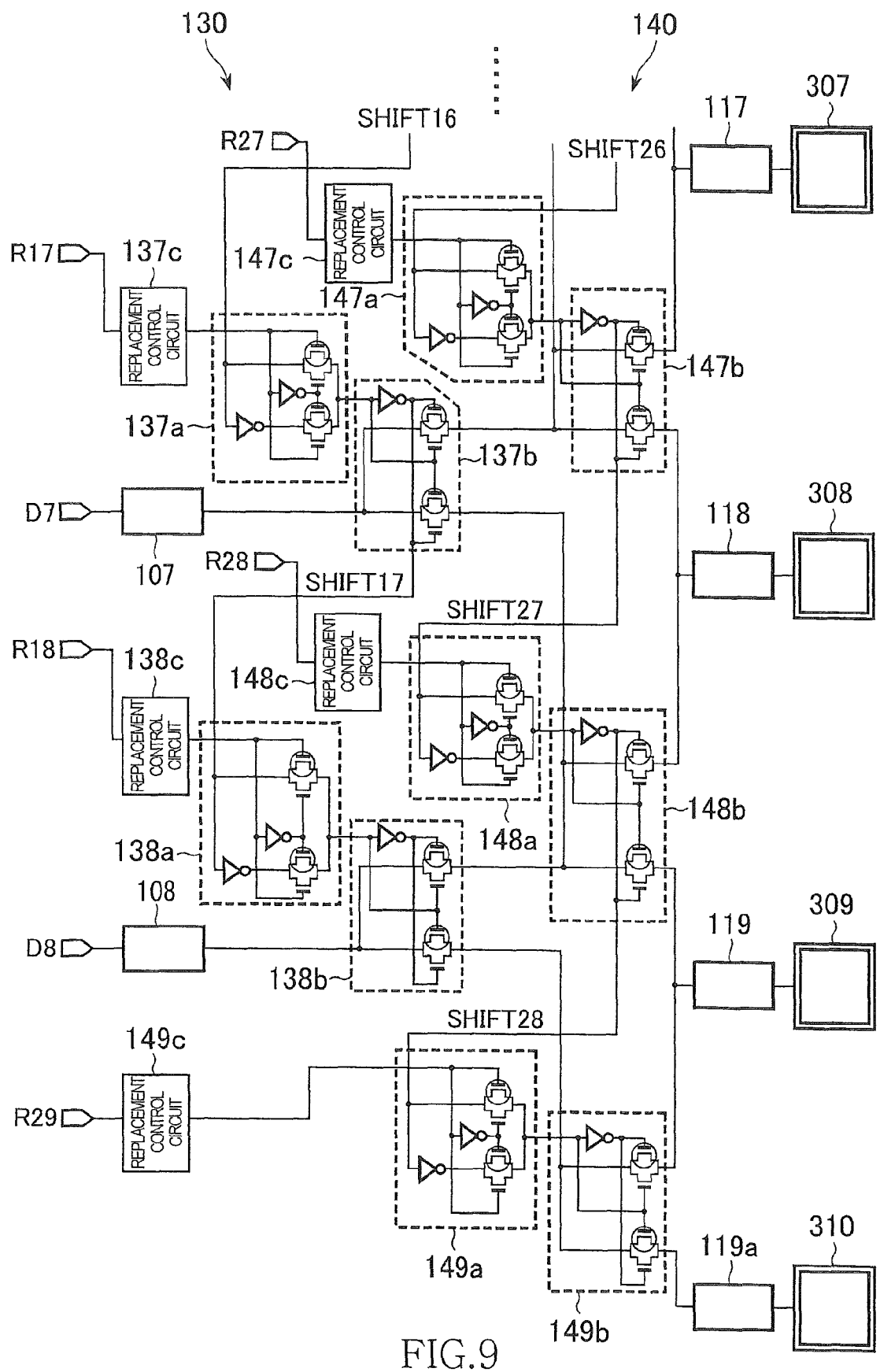
FIG. 9 is a circuit diagram showing in further detail a portion of the output switching circuits 130 and 140.

FIG. 9 is a circuit diagram showing in further detail a portion of the output switching circuits 130 and 140 shown in FIG. 8.

As shown in FIG. 9, the output switching circuit 130 has the same circuit configuration as the output switching circuit 120 except that it receives the relief signals R11 to R18 instead of the relief signals R1 to R8. Further, the output switching circuit 140 has the same circuit configuration as the output switching circuit 130 except that it is provided at a next stage of the output switching circuit 130 and it receives the relief signals R22 to R29. Specific circuit configurations and operations of the output switching circuits 130 and 140 are identical to those of the output switching circuit 120, and therefore explanations thereof will be omitted. Moreover, the same holds true for circuit configurations and operations of the input switching circuits 230 and 240.

As described above, in the second embodiment, the problem can be solved even when two through silicon vias are defective. Although not shown, a problem caused by three or more defective through silicon vias can be solved by providing three or more auxiliary through silicon vias.

The semiconductor memory device 10 according to the preferred embodiment of the present invention will be explained below in detail.

Figure 10:
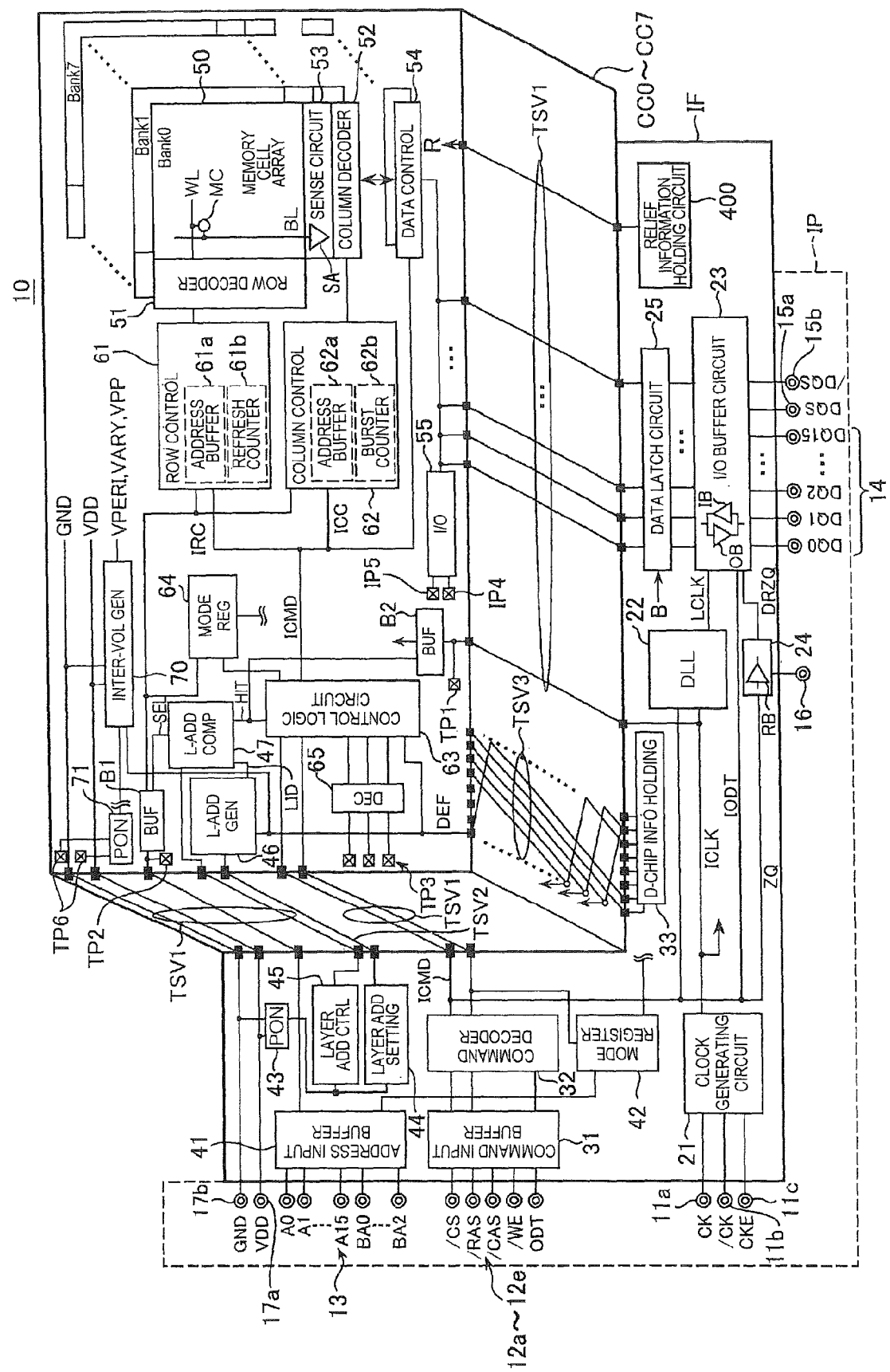
FIG. 10 is a block diagram showing the circuit configuration of the semiconductor memory device 10.

FIG. 10 is a block diagram showing the circuit configuration of the semiconductor memory device 10.

As shown in FIG. 10, the external terminals that are provided in the interposer IP include clock terminals 11a and 11b, an clock enable terminal 11c, command terminals 12a to 12e, an address terminal 13, a data input/output terminal 14, data strobe terminals 15a and 15b, a calibration terminal 16, and power supply terminals 17a and 17b. All of the external terminals are connected to the interface chip IF and are not directly connected to the core chips CC0 to CC7, except for the power supply terminals 17a and 17b.

First, a connection relationship between the external terminals and the interface chip IF performing the front end function and the circuit configuration of the interface chip IF will be described.

The clock terminals 11a and 11b are supplied with external clock signals CK and /CK, respectively, and the clock enable terminal 11c is supplied with a clock enable signal CKE. The external clock signals CK and /CK and the clock enable signal CKE are supplied to a clock generating circuit 21 provided in the interface chip IF. A signal where "/" is added to a head of a signal name in this specification indicates an inversion signal of a corresponding signal or a low-active signal. Accordingly, the external clock signals CK and /CK are complementary signals. The clock generating circuit 21 generates an internal clock signal ICLK, and the generated internal clock signal ICLK is supplied to various circuit blocks in the interface chip IF and is commonly supplied to the core chips CC0 to CC7 through the through silicon vias TSV.

A DLL circuit 22 is included in the interface chip IF and an input/output clock signal LCLK is generated by the DLL circuit 22. The input/output clock signal LCLK is supplied to an input/output buffer circuit 23 included in the interface chip IF. A DLL function is used to control the front end unit by using the signal LCLK synchronized with a signal of the external device, when the semiconductor memory device 10 communicates with the external device. Accordingly, DLL function is not needed for the core chips CC0 to CC7 as the back end.

The command terminals 12a to 12e are supplied with a row-address strobe signal /RAS, a column address strobe signal /CAS, a write enable signal /WE, a chip select signal /CS, and an on-die termination signal ODT. These command signals are supplied to a command input buffer 31 that is provided in the interface chip IF. The command signals supplied to the command input buffer 31 are further supplied to a command decoder 32. The command decoder 32 is a circuit that holds, decodes, and counts the command signals in synchronization with the internal clock ICLK and generates various internal commands ICMD. The generated internal command ICMD is supplied to the various circuit blocks in the interface chip IF and is commonly supplied to the core chips CC0 to CC7 through the through silicon vias TSV.

The address terminal 13 is a terminal to which address signals A0 to A15 and BA0 to BA2 are supplied, and the supplied address signals A0 to A15 and BA0 to BA2 are supplied to an address input buffer 41 provided in the interface chip IF. An output of the address input buffer 41 is commonly supplied to the core chips CC0 to CC7 through the through silicon vias TSV. The address signals A0 to A15 are supplied to a mode register 42 provided in the interface chip IF, when the semiconductor memory device 10 enters a mode register set. The address signals BA0 to BA2 (bank addresses) are decoded by an address decoder (not shown in the drawings) provided in the interface chip IF, and a bank selection signal B that is obtained by the decoding is supplied to a data latch circuit 25. This is because bank selection of the write data is performed in the interface chip IF.

The data input/output terminal 14 is used to input/output read data or write data DQ0 to DQ15. The data strobe terminals 15a and 15b are terminals that are used to input/output strobe signals DQS and /DQS. The data input/output terminal 14 and the data strobe terminals 15a and 15b are connected to the input/output buffer circuit 23 provided in the interface chip IF. The input/output buffer circuit 23 includes an input buffer IB and an output buffer OB, and inputs/outputs the read data or the write data DQ0 to DQ15 and the strobe signals DQS and /DQS in synchronization with the input/output clock signal LCLK supplied from the DLL circuit 22. If an internal on-die termination signal IODT is supplied from the command decoder 32, the input/output buffer circuit 23 causes the output buffer OB to function as a termination resistor. An impedance code DRZQ is supplied from the calibration circuit 24 to the input/output buffer circuit 23. Thereby, impedance of the output buffer OB is designated. The input/output buffer circuit 23 includes a well-known FIFO circuit.

The calibration circuit 24 includes a replica buffer RB that has the same circuit configuration as the output buffer OB. If the calibration signal ZQ is supplied from the command decoder 32, the calibration circuit 24 refers to a resistance value of an external resistor (not shown in the drawings) connected to the calibration terminal 16 and performs a calibration operation. The calibration operation is an operation for matching the impedance of the replica buffer RB with the resistance value of the external resistor, and the obtained impedance code DRZQ is supplied to the input/output buffer circuit 23. Thereby, the impedance of the output buffer OB is adjusted to a desired value.

The input/output buffer circuit 23 is connected to a data latch circuit 25. The data latch circuit 25 includes a FIFO circuit (not shown in the drawings) that realizes a FIFO function which operates by latency control realizing the well-known DDR function and a multiplexer MUX (not shown in the drawings). The input/output buffer circuit 23 converts parallel read data, which is supplied from the core chips CC0 to CC7, into serial read data, and converts serial write data, which is supplied from the input/output buffer, into parallel write data. Accordingly, the data latch circuit 25 and the input/output buffer circuit 23 are connected in serial and the data latch circuit 25 and the core chips CC0 to CC7 are connected in parallel. In this embodiment, each of the core chips CC0 to CC7 is the back end unit of the DDR3-type SDRAM and a prefetch number is 8 bits. The data latch circuit 25 and each banks of the core chips CC0 to CC7 are connected respectively, and the number of banks that are included in each of the core chips CC0 to CC7 is 8. Accordingly, connection of the data latch circuit 25 and the core chips CC0 to CC7 becomes 64 bits (8 bits×8 banks) for each DQ.

Parallel data, not converted into serial data, is basically transferred between the data latch circuit 25 and the core chips CC0 to CC7. That is, in a common SDRAM (in the SDRAM, a front end unit and a back end unit are constructed in one chip), between the outside of the chip and the SDRAM, data is input/output in serial (that is, the number of data input/output terminals is one for each DQ). However, in the core chips CC0 to CC7, an input/output of data between the interface chip IF and the core chips is performed in parallel. This point is the important difference between the common SDRAM and the core chips CC0 to CC7. However, all of the prefetched parallel data do not need to be input/output using the different through silicon vias TSV, and partial parallel/serial conversion may be performed in the core chips CC0 to CC7 and the number of through silicon vias TSV that are needed for each DQ may be reduced. For example, all of data of 64 bits for each DQ do not need to be input/output using the different through silicon vias TSV, and 2-bit parallel/serial conversion may be performed in the core chips CC0 to CC7 and the number of through silicon vias TSV that are needed for each DQ may be reduced to ½ (32).

To the data latch circuit 25, a function for enabling a test in an interface chip unit is added. The interface chip does not have the back end unit. For this reason, the interface chip cannot be operated as a single chip in principle. However, if the interface chip never operates as the single chip, an operation test of the interface chip in a wafer state may not be performed. This means that the semiconductor memory device 10 cannot be tested in case an assembly process of the interface chip and the plural core chips is not executed, and the interface chip is tested by testing the semiconductor memory device 10. In this case, when a defect that cannot be recovered exists in the interface chip, the entire semiconductor memory device 10 is not available. In consideration of this point, in this embodiment, a portion of a pseudo back end unit for a test is provided in the data latch circuit 25, and a simple memory function is enabled at the time of a test.

The power supply terminals 17*a* and 17*b* are terminals to which power supply potentials VDD and VSS are supplied, respectively. The power supply terminals 17*a* and 17*b* are connected to a power-on detecting circuit 43 provided in the interface chip IF and are also connected to the core chips CC0 to CC7 through the through silicon vias TSV. The power-on detecting circuit 43 detects the supply of power. On detecting the supply of power, the power-on detecting circuit activates a layer address control circuit 45 on the interface chip IF.

The layer address control circuit 45 changes a layer address due to the I/O configuration of the semiconductor device 10 according to the present embodiment. As described above, the semiconductor memory device 10 includes 16 data input/output terminals 14. Thereby, a maximum I/O number can be set to 16 bits (DQ0 to DQ15). However, the I/O number is not fixed to 16 bits and may be set to 8 bits (DQ0 to DQ7) or 4 bits (DQ0 to DQ3). The address allocation is changed according to the I/O number and the layer address is also changed. The layer address control circuit 45 changes the address allocation according to the I/O number and is commonly connected to the core chips CC0 to CC7 through the through silicon vias TSV.

The interface chip IF is also provided with a layer address setting circuit 44. The layer address setting circuit 44 is connected to the core chips CC0 to CC7 through the through silicon vias TSV. The layer address setting circuit 44 is cascade-connected to the layer address generating circuit 46 of the core chips CC0 to CC7 using the through silicon via TSV2 of the type shown in FIG. 2B, and reads out the layer addresses set to the core chips CC0 to CC7 at testing.

The interface chip IF is also provided with a defective chip information holding circuit 33. When a defective core chip that does not normally operates is discovered after an assembly, the defective chip information holding circuit 33 holds its chip number. The defective chip information holding circuit 33 is connected to the core chips CC0 to CC7 through the through silicon vias TSV. The defective chip information holding circuit 33 is connected to the core chips CC0 to CC7 while being shifted, by using the through silicon via TSV3 of the type shown in FIG. 2C.

The interface chip IF is also provided with a relief information holding circuit 400. The relief information holding circuit 400 stores the relief signal described above by anti-fuse elements and the like. When a defective through silicon via is discovered by an operation test after the assembly, the relief signal is written in the relief information holding circuit 400 by a tester. The relief signal held in the relief information holding circuit 400 is readout when the power is turned on, and the read relief signal is transmitted to the replacement control circuits 121*c* to 128*c* in the interface chip IF and is also transmitted to the replacement control circuits in the core chips CC0 to CC7 by using the through silicon via TSV1 of the type shown in FIG. 2A.

The above description is the outline of the connection relationship between the external terminals and the interface chip IF and the circuit configuration of the interface chip IF. Next, the circuit configuration of the core chips CC0 to CC7 will be described.

As shown in FIG. 10, memory cell arrays 50 that are included in the core chips CC0 to CC7 performing the back end function are divided into eight banks. A bank is a unit that can individually receive a command. That is, the individual banks can be independently and nonexclusively controlled. From the outside of the semiconductor memory device 10, each back can be independently accessed. For example, a part of the memory cell array 50 belonging to the bank 1 and another part of the memory cell array 50 belonging to the bank 2 are controlled nonexclusively. That is, word lines WL and bit lines BL corresponding to each banks respectively are independently accessed at same period by different commands one another. For example, while the bank 1 is maintained to be active (the word lines and the bit lines are controlled to be active), the bank 2 can be controlled to be active. However, the external terminals (for example, plural control terminals and plural I/O terminals) of the semiconductor memory device 10 are shared. In the memory cell array 50, the plural word lines WL and the plural bit lines BL intersect each other, and memory cells MC are disposed at intersections thereof (in FIG. 10, only one word line WL, one bit line BL, and one memory cell MC are shown). The word line WL is selected by a row decoder 51. The bit line BL is connected to a corresponding sense amplifier SA in a sense circuit 53. The sense amplifier SA is selected by a column decoder 52.

The row decoder 51 is controlled by a row address supplied from a row control circuit 61. The row control circuit 61 includes an address buffer 61*a* that receives a row address supplied from the interface chip IF through the through silicon via TSV, and the row address that is buffered by the address buffer 61*a* is supplied to the row decoder 51. The address signal that is supplied through the through silicon via TSV is supplied to the row control circuit 61 through the input buffer B1. The row control circuit 61 also includes a refresh counter 61*b*. When a refresh signal is issued by a control logic circuit 63, a row address that is indicated by the refresh counter 61*b* is supplied to the row decoder 51.

The column decoder 52 is controlled by a column address supplied from a column control circuit 62. The column control circuit 62 includes an address buffer 62*a* that receives the column address supplied from the interface chip IF through the through silicon via TSV, and the column address that is buffered by the address buffer 62*a* is supplied to the column decoder 52. The column control circuit 62 also includes a burst counter 62*b* that counts the burst length.

The sense amplifier SA selected by the column decoder 52 is connected to the data control circuit 54 through some amplifiers (sub-amplifiers or data amplifiers or the like) which are not shown in the drawings. Thereby, read data of 8 bits (=prefetch number) for each I/O (DQ) is output from the data control circuit 54 at reading, and write data of 8 bits is input to the data control circuit 54 at writing. The data control circuit 54 and the interface chip IF are connected in parallel through the through silicon via TSV.

The control logic circuit 63 receives an internal command ICMD supplied from the interface chip IF through the through silicon via TSV and controls the row control circuit 61 and the column control circuit 62, based on the internal command ICMD. The control logic circuit 63 is connected to a layer address comparing circuit (chip information comparing circuit) 47. The layer address comparing circuit 47 detects whether the corresponding core chip is target of access, and the detection is performed by comparing a SEL (chip selection information) which is a part of the address signal supplied from the interface chip IF through the through silicon via TSV and a layer address LID (chip identification information) set to the layer address generating circuit 46. When the layer address comparing circuit 47 detects a match, it activates a match signal HIT.

In the layer address generating circuit 46, unique layer addresses are set to the core chips CC0 to CC7, respectively, at initialization. A method of setting the layer addresses is as follows. First, after the semiconductor memory device 10 is initialized, a minimum value (0, 0, 0) as an initial value is set to the layer address generating circuits 46 of the core chips CC0 to CC7. The layer address generating circuits 46 of the core chips CC0 to CC7 are cascade-connected using the through silicon vias TSV of the type shown in FIG. 2B, and have increment circuits provided therein. The layer address (0, 0, 0) that is set to the layer address generating circuit 46 of the core chip CC0 of the uppermost layer is transmitted to the layer address generating circuit 46 of the second core chip CC1 through the through silicon via TSV and is incremented. As a result, a different layer address (0, 0, 1) is generated. Hereinafter, in the same way as the above case, the generated layer addresses are transmitted to the core chips of the lower layers and the layer address generating circuits 46 in the core chips increment the transmitted layer addresses. A maximum value (1, 1, 1) as a layer address is set to the layer address generating circuit 46 of the core chip CC7 of the lowermost layer. Thereby, the unique layer addresses are set to the core chips CC0 to CC7, respectively.

The layer address generating circuit 46 is provided with a defective chip signal DEF supplied from the defective chip information holding circuit 33 of the interface chip IF, through the through silicon via TSV. As the defective chip signal DEF is supplied to the individual core chips CC0 to CC7 using the through silicon via TSV3 of the type shown in FIG. 2C, the defective chip signals DEF can be supplied to the core chips CC0 to CC7, individually. The defective chip signal DEF is activated when the corresponding core chip is a defective chip. When the defective chip signal DEF is activated, the layer address generating circuit 46 transmits, to the core chip of the lower layer, a non-incremented layer address, not an incremented layer address. The defective chip signal DEF is also supplied to the control logic circuit 63. When the defective chip signal DEF is activated, the control logic circuit 63 is completely halted. Thereby, the defective core chip performs neither read operation nor write operation, even though an address signal or a command signal is input from the interface chip IF.

An output of the control logic circuit 63 is also supplied to a mode register 64. When an output of the control logic circuit 63 shows a mode register set, the mode register 64 is updated by an address signal. Thereby, operation modes of the core chips CC0 to CC7 are set.

Each of the core chips CC0 to CC7 has an internal voltage generating circuit 70. The internal voltage generating circuit 70 is provided with power supply potentials VDD and VSS. The internal voltage generating circuit 70 receives these power supply potentials and generates various internal voltages. As the internal voltages that are generated by the internal voltage generating circuit 70, an internal voltage VPERI (≈VDD) for operation power of various peripheral circuits, an internal voltage VARY (<VDD) for an array voltage of the memory cell array 50, and an internal voltage VPP (>VDD) for an activation potential of the word line WL are included. In each of the core chips CC0 to CC7, a power-on detecting circuit 71 is also provided. When the supply of power is detected, the power-on detecting circuit 71 resets various internal circuits.

The peripheral circuits in the core chips CC0 to CC7 operates in synchronization with the internal clock signal ICLK that is supplied form the interface chip IF through the through silicon via TSV. The internal clock signal ICLK supplied through the through silicon via TSV is supplied to the various peripheral circuits through the input buffer B2.

The above description is the basic circuit configuration of the core chips CC0 to CC7. In the core chips CC0 to CC7, the front end unit for an interface with the external device is not provided. Therefore the core chip cannot operate as a single chip in principle. However, if the core chip never operates as the single chip, an operation test of the core chip in a wafer state may not be performed. This means that the semiconductor memory device 10 cannot be tested, before the interface chip and the plural core chips are fully assembled. In other words, the individual core chips are tested when testing the semiconductor memory device 10. When unrecoverable defect exists in the core chips, the entire semiconductor memory device 10 is led to be unavailable. In this embodiment, in the core chips CC0 to CC7, a portion of a pseudo front end unit, for testing, that includes some test pads TP and a test front end unit of a test command decoder 65 is provided, and an address signal and test data or a command signal can be input from the test pads TP. It is noted that the test front end unit is provided for a simple test in a wafer test, and does not have all of the front end functions in the interface chip. For example, since an operation frequency of the core chips is lower than an operation frequency of the front end unit, the test front end unit can be simply realized with a circuit that performs a test with a low frequency.

Kinds of the test pads TP are almost the same as those of the external terminals provided in the interposer IP. Specifically, the test pads include a test pad TP1 to which a clock signal is input, a test pad TP2 to which an address signal is input, a test pad TP3 to which a command signal is input, a test pad TP4 for input/output test data, a test pad TP5 for input/output a data strobe signal, and a test pad TP6 for a power supply potential.

A common external command (not decoded) is input at testing. Therefore, the test command decoder 65 is also provided in each of the core chips CC0 to CC7. Because serial test data is input and output at testing, a test input/output circuit 55 is also provided in each of the core chips CC0 to CC7.

This is the entire configuration of the semiconductor memory device 10. Because in the semiconductor memory device 10, the 8 core chips of 1 Gb are laminated, the semiconductor memory device 10 has a memory capacity of 8 Gb in total. Because the chip selection signal /CS is input to one terminal (chip selection terminal), the semiconductor memory device is recognized as a single DRAM having the memory capacity of 8 Gb, in view of the controller.

In the semiconductor memory device 10 having the configuration mentioned above, the relief signal held in the relief information holding circuit 400 is read out when the power is turned on, and the read relief signal is transmitted to the replacement control circuits in the interface chip IF and the core chips CC0 to CC7. As explained above, in the interface chip IF and the core chips CC0 to CC7, the defective through silicon via is not simply replaced by the auxiliary through silicon via, but the defective through silicon via is bypassed by shifting the connection relation. Therefore, almost no difference in the wiring lengths occurs between signal paths before and after replacement of the through silicon vias. Thus, because almost no skew is generated, the signal quality can be enhanced.

It is apparent that the present invention is not limited to the above embodiments, but may be modified and changed without departing from the scope and spirit of the invention.

For example, in the above embodiments, a case of supplying data from the interface chip IF to the core chips CC0 to CC7 is explained; however, in reverse, the same holds true when supplying data from the core chips CC0 to CC7 to the interface chip IF. That is, it is possible to provide the driver circuit on the core chips CC0 to CC7 side and provide the receiver circuits on the interface chip IF side. Because the write data supplied from the interface chip IF to the core chips CC0 to CC7 and the read data supplied from the core chips CC0 to CC7 to the interface chip IF are transmitted via the same through silicon vias, for such through silicon vias, both the driver circuits and the receiver circuits are provided in each of the interface chip IF and the core chips CC0 to CC7.

For example, in the above embodiments, a chip-stacked DRAM has been explained as an example. However, in the present invention, the type of semiconductor chips to be stacked is not particularly limited thereto. It can be other memory devices such as an SRAM, a PRAM, an MRAM, an RRAM, and a flash memory, or can be a logical system device such as a CPU and a DSP.

What is claimed is:

1. A semiconductor device comprising:
   a plurality of n data circuits;
   a plurality of n adjacent through silicon vias;
   an auxiliary through silicon via;
   a relief information circuit configured to provide a plurality of relief signals to identify a defective through silicon via x in the plurality of n through silicon vias, wherein x is an integer greater than 1 and n is an integer greater than x; and
   a plurality of n switch circuits, the plurality of n switch circuits being configured so that x−1 switch circuits of the n switch circuits are activated based on the relief signals to connect x−1 data circuits to through silicon vias 1 to x−1 in the plurality of n adjacent through silicon vias, n−x switch circuits of the n switch circuits are activated based on the relief signals to connect n−x data circuits to through silicon vias x+1 to n in the plurality of n adjacent through silicon vias, and a switch circuit of the n switch circuits is activated based on the relief signals to connect a data circuit to the auxiliary through silicon via;
   wherein each of the n switch circuits is configured to receive a data signal from a corresponding one of the n data circuits and to output the data signal to one of two through silicon vias of the n adjacent through silicon vias and the auxiliary through silicon via depending on the relief signals.

2. The semiconductor device as claimed in claim 1, wherein the data circuit comprises a data driver circuit.

3. The semiconductor device as claimed in claim 1, wherein the data circuit comprises a data receiver circuit.

4. The semiconductor device as claimed in claim 1, wherein the plurality of relief signals provided by the relief information circuit comprises n relief signals.

5. The semiconductor device as claimed in claim 4, wherein one of the n relief signals is activated when a corresponding through silicon via in the group of n adjacent through silicon vias is identified as defective.

6. The semiconductor device as claimed in claim 1, further comprising an interface chip, wherein the plurality of relief signals is received from the interface chip.

7. The semiconductor device as claimed in claim 1, wherein the plurality of relief signals is received from the relief information holding circuit.

8. The semiconductor device as claimed in claim 7, wherein the relief information holding circuit comprises anti-fuse elements.

9. The semiconductor device as claimed in claim 7, wherein the relief information holding circuit stores relief information supplied by a tester.

10. The semiconductor device as claimed in claim 9, wherein the tester discovers the defective through silicon via by performing an operation test.

11. The semiconductor device as claimed in claim 1, wherein the switch circuits comprise transfer gates.

12. The semiconductor device as claimed in claim 1, wherein each of the n switch circuits comprise two transfer gates.

13. The semiconductor device as claimed in claim 1, wherein the semiconductor device is one of a DRAM, SRAM, PRAM, MRAM, RRAM, flash memory, a CPU, or a DSP, or some combination thereof.

* * * * *